INVENTORS E. P. FELCH
J. O. ISRAEL
O. KUMMER
BY Franklin Mohr
ATTORNEY

INVENTORS E. P. FELCH
J. O. ISRAEL
O. KUMMER
BY Franklin Mohr
ATTORNEY

Oct. 1, 1957 E. P. FELCH ET AL 2,808,509

FREQUENCY CONTROLLED VARIABLE OSCILLATOR

Filed March 19, 1954 6 Sheets-Sheet 3

INVENTORS E. P. FELCH
J. O. ISRAEL
O. KUMMER

BY Franklin Mohr
ATTORNEY

FREQUENCY CONTROLLED VARIABLE OSCILLATOR

Filed March 19, 1954 6 Sheets-Sheet 4

INVENTORS E. P. FELCH
J. O. ISRAEL
O. KUMMER
BY Franklin Mohr
ATTORNEY

INVENTORS E. P. FELCH
J. O. ISRAEL
O. KUMMER
BY Franklin Mohr
ATTORNEY

Oct. 1, 1957 E. P. FELCH ET AL 2,808,509

FREQUENCY CONTROLLED VARIABLE OSCILLATOR

Filed March 19, 1954 6 Sheets-Sheet 6

INVENTORS E. P. FELCH
J. O. ISRAEL
O. KUMMER

BY Franklin Mohr
ATTORNEY

1

2,808,509

FREQUENCY CONTROLLED VARIABLE OSCILLATOR

Edwin P. Felch, Chatham, John O. Israel, West Orange, and Oscar Kummer, Basking Ridge, N. J., assignors to Bell Telephone Laboratories, Incorporated, New York, N. Y., a corporation of New York Application March 19, 1954, Serial No. 417,475

11 Claims. (Cl. 250—36)

This invention relates to highly precise means and methods for setting up and maintaining a wave, the frequency of which is related to and automatically controlled by the frequency or frequencies of one or more standard reference sources.

Complex automatic frequency control systems of the prior art have been capable of controlling oscillators to produce frequencies derived from an integral multiple of a standard frequency, modified by addition or subtraction of the frequency of an interpolation oscillator. Such systems have, however, suffered from several faults, to overcome which the present invention is directed. Accordingly, the objects of the invention include the following:

(*a*) To provide widely continuous, unambiguous frequency coverage over a range embracing a plurality of cardinal (harmonic multiple frequency) points.

(*b*) To provide continuously variable interpolation means capable of sweeping from below one cardinal point up to and beyond the next higher cardinal point without ambiguity.

(*c*) To obtain sufficient stable loop gain in the control loop to attain the desired stability of operation at high harmonic ratios.

(*d*) To cover a frequency range of several octaves without recourse to multiple tuning or switching of numerous networks in addition to the adjustment of the oscillator.

(*e*) To employ in the control portions of the system such as the mixers and phase comparators, substantially only aperiodic coupling circuits, such as substantially purely resistive networks, or networks of the band pass type, or so-called broad band circuits, or other circuits of this general type which are known to those skilled in the art, and which have no stringent requirements as to discrimination against nearby frequencies.

(*f*) To avoid ambiguities of frequency identification, not only in the vicinity of cardinal points, but also in the vicinity of midway between cardinal points.

Some of the principles involved in achieving these objects may be stated as follows:

The ability to sweep through cardinal points without complication is achieved by allocation of frequencies for the various oscillators, mixers, and phase comparators, such that none of these frequencies need ever approach zero frequency, i. e., by the use of frequency offsets.

Ambiguity as to whether it is addition or subtraction that is taking place in the mixers is also avoided by suitable frequency allocations which in turn avoid folding and overlapping of frequency bands of upper and lower sideband frequencies, or which in fact widely separate the sidebands so that practically only one sideband is available.

Stable loop gain is attained by restricting amplification around the control loop to frequencies sufficiently above the region of zero frequency to avoid the well known instability associated with low level direct current amplification. In the systems illustrated, gain in the control loops is principally restricted to frequencies of 10 kilocycles or more.

High, stable gains in the control loops permit the use of the above mentioned aperiodic circuits in spite of their lower efficiency, especially in conjunction with the above described choice of frequencies to avoid the need of discrimination between nearly equal frequencies which might not be filterable one from the other.

Otherwise stated, a feature of the invention is that no oscillator in the system that must be accurately calibrated need cover a frequency range beginning at or near zero frequency, but each such oscillator may be given a suitable frequency offset. If desired, however, an oscillator may have an assigned frequency range extending below the fundamental frequency of the reference standard to any desired minimum frequency.

Another feature is that no narrow band filtering is required, as adjacent harmonic frequencies are distinguished by means other than filtering, e. g., by means of calibrated oscillators.

A further feature is that no zero frequency or direct current components are utilized, either in the automatic frequency control loops or elsewhere, in any portion of the system where noise levels or unstable operating conditions are a factor.

It is known in the art that an oscillator can be synchronized with a desired harmonic of a wave of standard frequency by means of automatic frequency control applied to the oscillator, the control wave being derived by making a phase comparison between the wave generated by the oscillator and a train of short pulses synchronous with the wave of standard frequency. This system of synchronization has been limited in the past to not more than perhaps the two-hundredth harmonic of the standard frequency. It is desirable to extend the range of such a synchronizing system, and, in accordance with the present invention, by use of special arrangements it has been found possible to synchronize an oscillator with the nearest harmonic up to and including the two-thousandth or even higher harmonic of a standard frequency. This makes possible either extending the upper limit of frequencies that can be controlled or providing reference harmonics at closer intervals over a given frequency range.

Also in accordance with the invention, there is provided a frequency-offset interpolation oscillator which covers the relatively narrow frequency range between one harmonic of the standard frequency and the next harmonic. By frequency addition or subtraction involving a harmonic of the standard frequency and a selected frequency from the interpolation oscillator, a continuous spectrum of frequencies is made available, any frequency being determined with an error that does not exceed the sum of the individual calibration errors of the standard source and the interpolation oscillator. It is a matter of choice whether addition or subtraction is used, but one or the other should be used exclusively in order to avoid ambiguity.

In further accordance with the invention, uncertainty of identification is eliminated as to the exact ordinal number of the harmonic with which synchronism is being had.

To achieve the objects of the present invention it is desirable in many cases to utilize the known principles of the heterodyne form of oscillator and to employ heterodyne oscillators as sources of waves, the frequency of which may be controlled by controlling one or more of the component oscillators making up the combination known as the heterodyne oscillator, but oscillators of nonheterodyne type may also be used.

The achievement of the desired objects requires strict attention to the matter of preserving a favorable value of signal-to-noise level in the control paths leading to the automatic frequency control systems that are used in effecting synchronization.

A feature of the invention is a phase comparator arrangement which utilizes a broad band of frequencies and is capable of performing in uniform manner and without manual tuning or narrow band filtering or manual or automatic switching regardless of which harmonic is serving to effect synchronism, from the fundamental control frequency up to its two-thousandth or even higher harmonic.

Figure 10:
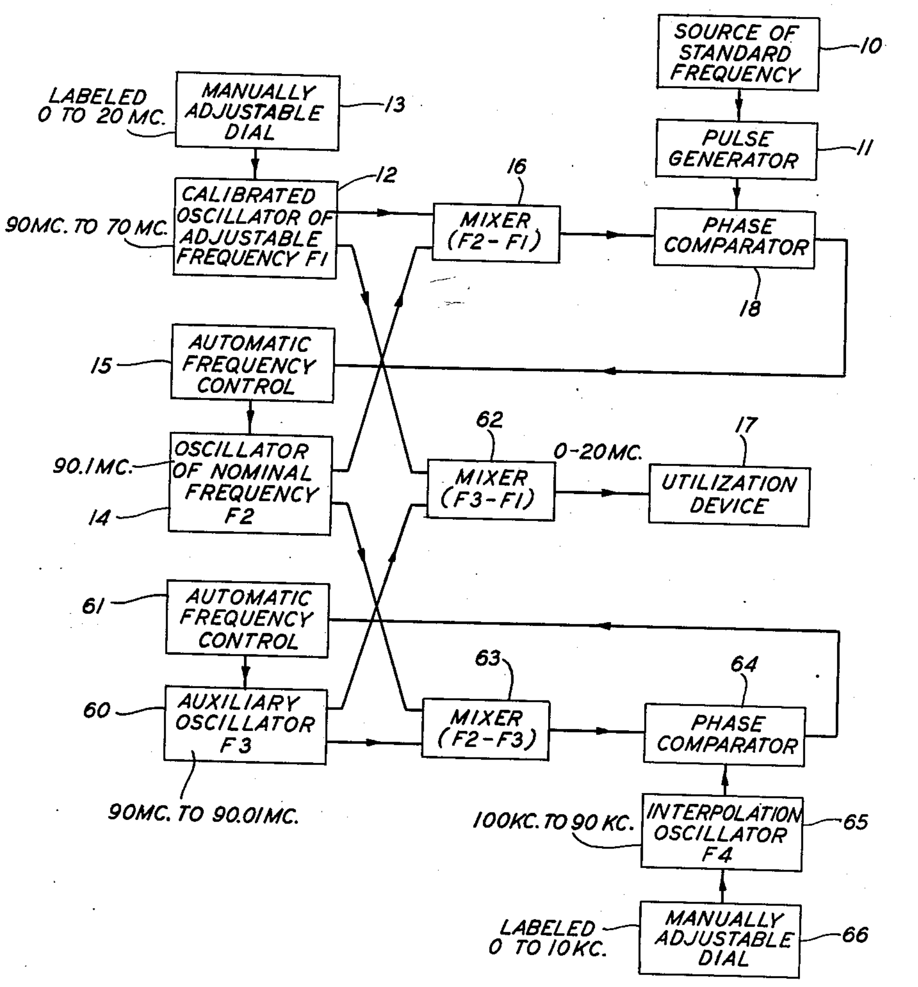
Figure 11:
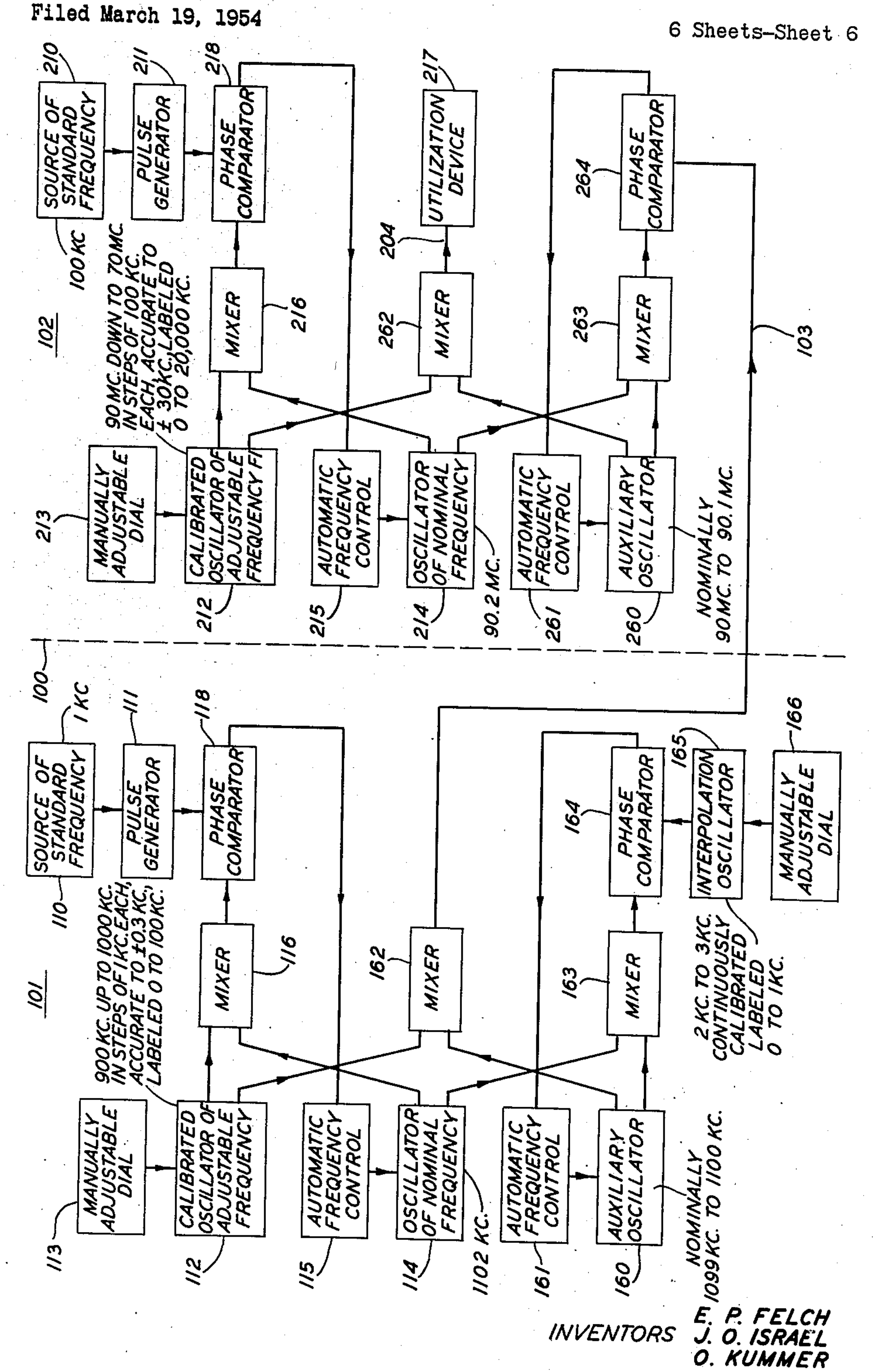

Fig. 10 is a block schematic diagram of a system for synchronizing the output wave of a heterodyne oscillator at any desired frequency made up of the difference of a harmonic of a standard frequency source and a frequency supplied by a calibrated oscillator of adjustable frequency; and Fig. 11 is a block schematic diagram of a system which combines two units each like the system shown in Fig. 10 to secure a system performing the functions of the system of Fig. 10 with less stringent requirements upon some of the component parts.

Figure 1:
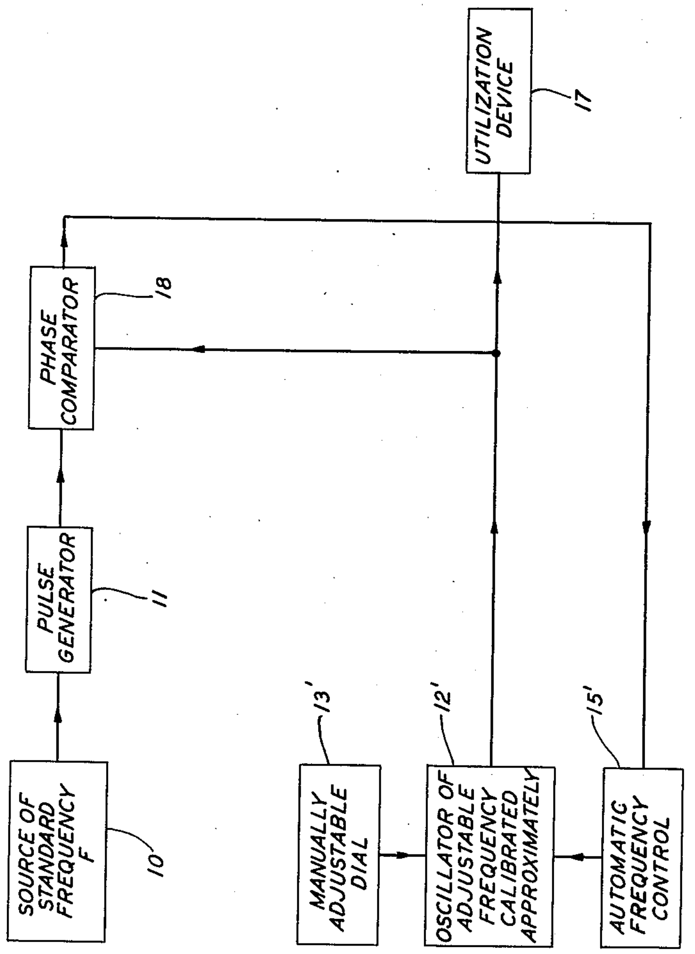
Fig. 1 is a block schematic diagram of a system for synchronizing the output wave of an oscillator with any selected harmonic from a source of standard frequency.

Fig. 1 shows an arrangement for locking a source having a frequency of relatively small stability into synchronism with any desired harmonic NF of a relatively stable source of standard frequency F. The source 10 of standard frequency actuates a pulse generator 11 of any suitable known form. The pulses produced by the generator 11 should be of very short duration, such for example as not longer than one four-thousandth of the periodic time of the fundamental frequency of the standard source where it is desired to synchronize with any one of 2000 harmonics. More generally, if it is desired to synchronize with any harmonic up to the harmonic NF, the pulse duration should not exceed approximately one 2Nth of the period of the F frequency, that is, $$\frac{1}{2NF}$$

second.

The source of relatively small stability of frequency may be an oscillator of practically any type, or, as is found advantageous for many uses, a combination of two oscillators and a mixer for producing the sum or difference of the frequencies of the two oscillators. In Fig. 1, there is shown a single oscillator 12′ of adjustable frequency, calibrated approximately and covering the frequency range from a given minimum frequency up to the highest usable harmonic of the standard source. A manually adjustable dial 13′ or other suitable means is provided for setting the frequency of the oscillator 12′ with a moderate degree of precision to any desired value by reference to the approximate calibration which may be inscribed upon the dial in the usual known manner. The oscillator 12′ is provided with an automatic frequency control device 15′ of any suitable known type.

A portion of the output of the oscillator 12′ may be fed to any utilization device as shown at 17. Another portion of the output of the oscillator is fed to a phase comparator 18, illustrative forms of which are shown in Figs. 3, 4, 5, and 6. In the phase comparator 18, there is produced a control potential of suitable amplitude to actuate the automatic frequency control 15′ to which the output of the arrangement 18 is connected. The control wave is produced by the joint action of the oscillator output wave and pulses of standard frequency controlled by the source 10 and impressed upon the arrangement 18 from the pulse generator 11 as shown. The control wave actuates the control device 15′ which varies the frequency of the oscillator until the oscillator frequency is equal to the particular harmonic frequency NF which initially is nearest to the oscillator frequency. Once synchronism has been established, it is found that the dial 13′ may be varied in its setting within a certain narrow range without loss of synchronism. This range is termed the holding range. Any desired harmonic may be obtained by further varying the dial 13′ in accordance with the calibration. When the dial 13′ is moved beyond the holding range to a point near the frequency $(N\pm1)F$, the automatic frequency control pulls the system into synchronism with the next adjacent harmonic. This point is called the catching point. The range between catching points above and below any one harmonic frequency point is called the catching range. The catching range is preferably at least equal to the error range of the oscillator but not greater than the harmonic interval F. Usually the catching range is narrower than the holding range.

If the holding range of one harmonic overlaps the catching range for an adjacent harmonic, no frequency intermediate between the two harmonic frequencies will be produced by the oscillator 12′ while the described control is in effect.

Within the holding range, the automatic frequency control compensates the effect upon the oscillator frequency of turning the dial 13′ up to the limit of the automatic frequency control. When the limit is exceeded, the oscillator frequency may begin to change due to lack of sufficient compensatory action of automatic frequency control 15′. The output of phase comparator 18 when the holding range is exceeded will contain components of the frequency difference between the instantaneous frequency of oscillator 12′ and the nearest harmonic multiple frequency as hereinafter demonstrated. If the system at this point is within the catching range these components cause the automatic frequency control 15′ to change the frequency of the oscillator 12′ to the nearest harmonic multiple frequency.

To avoid ambiguity and to permit the oscillator to jump from one harmonic to the next as the dial 13′ is turned, the sum of holding range and catching range should at least slightly exceed twice the harmonic interval or spacing. If the sum of holding range and catching range is less than twice the harmonic interval, there will be an interval in the setting of the oscillator wherein no control is afforded. It is evident that no ambiguity can result provided the holding range is suitably restricted so as not to overlap the next adjacent harmonic.

Figure 2:
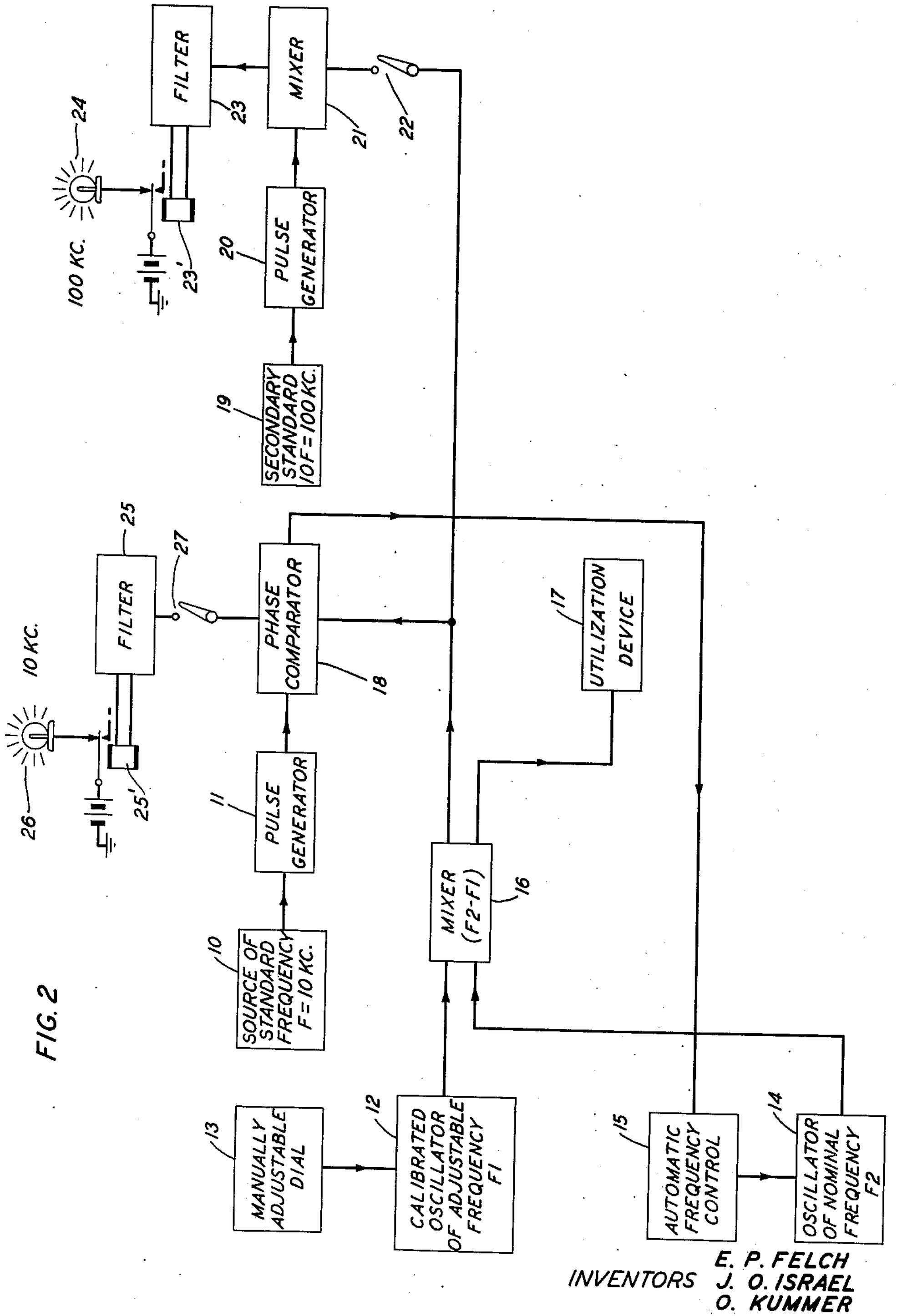
Fig. 2 is a block schematic diagram showing an extension of the system of Fig. 1 to a heterodyne oscillator.

In Fig. 2, a combination of two oscillators is shown in place of the single oscillator 12′ of Fig. 1. One such oscillator 12 is of adjustable frequency, hereinafter designated F1, covering a frequency range preferably as wide as the range from F to the highest usable harmonic of the standard source. The range of the oscillator 12 is, however, preferably offset from the range starting at zero frequency, to reduce the percentage of frequency variation required. For example, where the highest usable harmonic is 20,000 kilocycles per second (for brevity usually stated as simply 20,000 kilocycles), the oscillator 12 may range from, say, 70 megacycles to 90 megacycles. A manually adjustable dial 13 or other suitable means is provided for setting the frequency of the oscillator 12 with a moderate degree of precision to any desired value. Another oscillator 14 of frequency to be designated F2 is provided with an automatic frequency control device 15 of any suitable known type.

The output terminals of the oscillators 12 and 14 are jointly connected to the input terminals of a mixer 16 of any known design for producing by the heterodyne principle a useful output wave equal in frequency to, for example, the difference frequency, $F2-F1$. A portion of the output of the mixer may be fed to the utilization device 17. Another portion of the output of the mixer is fed to the phase comparator 18 illustrative forms of which are shown in Figs. 3, 4, 5, and 6. In the arrangement designated by 18, there is produced a control potential of suitable amplitude to actuate the automatic frequency control 15 to which the output of the arrangement 18 is connected. The control wave is produced by the joint action of the output wave of frequency $(F2-F1)$ from the mixer 16 and the pulses of standard frequency controlled by the source 10, which are impressed upon the phase comparator 18 from the pulse generator 11 as shown. The control wave actuates the control 15 which varies the frequency F2 until the difference frequency $(F2-F1)$ is equal to the particular harmonic frequency NF which initially is nearest to the frequency $(F2-F1)$. For convenience and to prevent error, the dial 13 may be calibrated in steps labeled according to the value of NF instead of the actual value of the frequency generated by the oscillator 12.

Although the calibration of the dial 13 need not be exceedingly precise, it is, however, necessary that precaution be taken to make sure that the harmonic indicated by the calibration on dial 13 will be the one desired, that is, N and not some other harmonic such as for example $(N-1)$ or $(N+1)$. Taking as a numerical example a standard frequency F of 10 kilocycles, the harmonics are 10 kilocycles apart and it is found in practice that the calibration of dial 13 must be accurate to within about three kilocycles in order to select the desired harmonic without mistake. This precaution applies to the systems shown both in Fig. 1 and Fig. 2.

In order to check the calibration of the dial 13, a secondary standard wave source 19 may be provided, as shown in Fig. 2, for example a 100 kilocycle secondary source when source 10 is 10 kilocycles. The source 19 actuates a pulse generator 20 which latter applies pulses to a mixer 21 along with a portion of the $(F2-F1)$ wave from the mixer 16, which will be admitted when a switch 22 as shown in Fig. 2 is closed. The output of the mixer 21 is coupled to a filter 23 which rejects the frequency of 100 kilocycles and controls (preferably lights) a lamp 24 or other signal device as through a back contact of a relay 23' in known manner when a wave component of 100 kilocycles is predominant in the output of the mixer 21. The calibration of the dial 13 may be checked by setting the dial in turn for each multiple of 100 kilocycles and noting whether or not the lamp 24 is lighted or other suitable indication is observed at each such setting.

To check for lock-in, a filter 25 and signal 26 may be connected to the output of the phase comparator 18, as through a switch 27. The filter 25 rejects the fundamental standard frequency, for example 10 kilocycles. When lock-in is effective, there are no frequencies present at this point except 10 kilocycles and multiples of 10 kilocycles. The filter 25 rejects these, and thus there is no output in the locked-in condition. When the lock-in is not effective, the output of the phase comparator will contain other frequencies, in particular, frequencies less than 10 kilocycles. There is thus an output from the filter 25 and this is used to energize the relay 25' and extinguish the lamp 26.

It is advantageous to use two oscillators such as 12 and 14 and a mixer 16 to supply the frequency controlled wave rather than a single oscillator, in that the limits of the frequency range of the calibrated oscillator may be placed in a favorable portion of the frequency spectrum. A single oscillator tunable over a range from 10,000 to 20,000,000 cycles per second is more difficult to build and to calibrate precisely than one, for example tunable from 70 megacycles to 90 megacycles per second. When oscillator 12 covers the latter range, a suitable nominal value of F2 for oscillator 14 is approximately 90 megacycles per second.

Figure 3:
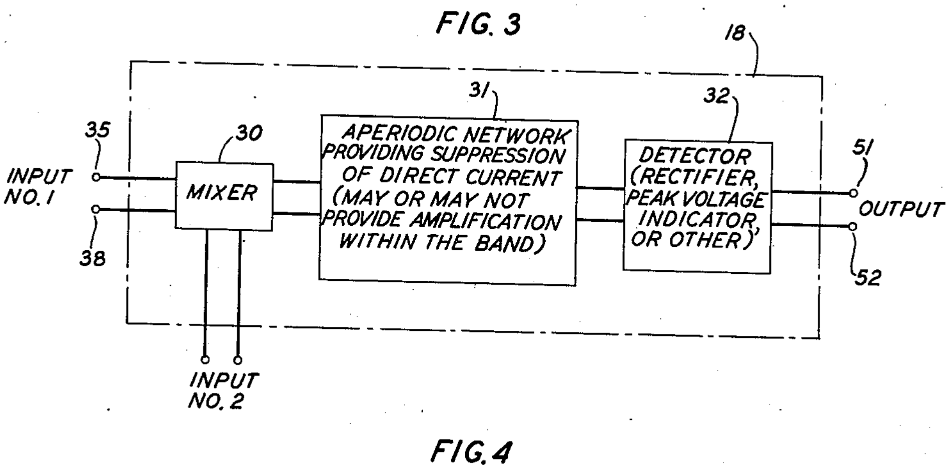
Fig. 3 is a block schematic diagram of a phase comparator for developing a control wave to be used in automatic frequency control in accordance with the invention.

In the arrangement of Fig. 3 the combination of elements such as mixer 30, aperiodic network 31 (which may include an amplifier) and detector 32, collectively referred to herein as phase comparator 18, is used to compare the phase of a sinusoidal wave coming in from any source with the phase of pulses applied to the device from a pulse generator. The term "aperiodic" as used herein in regard to network 31 is intended to apply generally to any network that is capable of passing alternating current extending over a broad band of frequencies, that includes no tuned circuit elements, and that effectively blocks the passage of a direct-current component. The device 18 develops a control wave that varies in amplitude in response to any change of phase relationship between the sinusoidal wave and the pulse and is used to vary the frequency of the sinusoidal wave until no frequency deviation remains between the pulse train and the sinusoidal wave. When there is no frequency deviation between the wave and the pulse the phase relationship between the two is constant, i. e., frequency locking has been effected. Thus, the control wave ceases to vary in amplitude and assumes a steady value dependent upon the particular phase difference between the sinusoidal wave and the nearest pulse harmonic frequency at the instant when a condition of frequency lock is reached.

Figure 4:
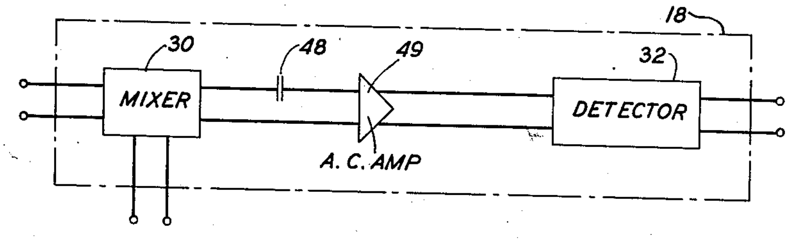
Figs. 4, 5 and 6 are schematic diagrams showing particular forms of the device of Fig. 3.
Figure 5:
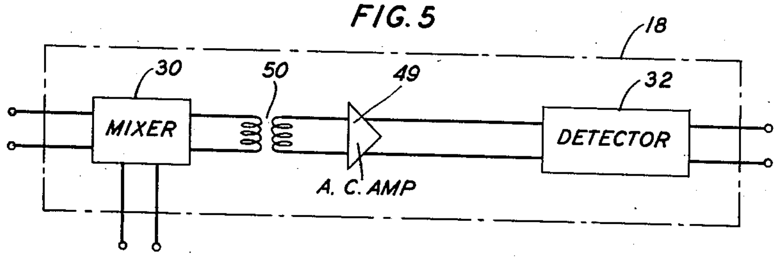
Figure 6:
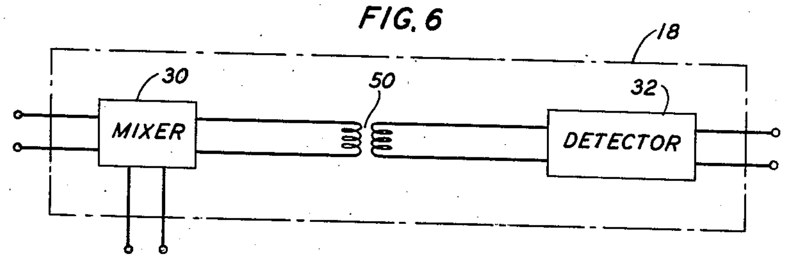

Particularizations of the arrangement of Fig. 3, shown in Figs. 4, 5, and 6, illustrating various means for suppressing direct current and establishing a definite lower cut-off frequency in the network 31, will be discussed in detail hereinafter, following a description of the mixer 30.

Figure 7:
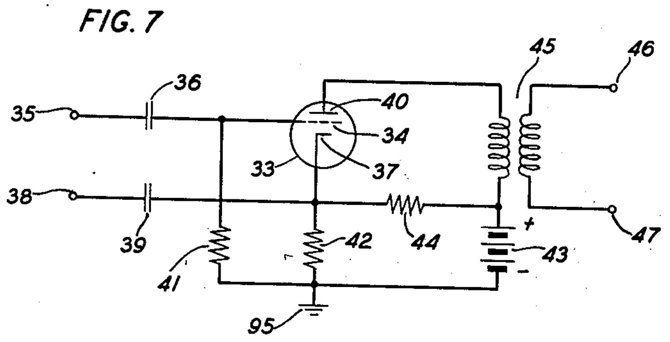
Fig. 7 is a schematic diagram of a mixer circuit suitable for use as a component part of any of the devices shown in Figs. 3 through 6.

Various suitable mixing circuits are known in the art, one being selected for illustration in detail in Fig. 7 comprising a triode tube 33 with one input applied to the control grid 34 between ground 95 and an input terminal 35 through a coupling condenser 36. The other input is applied to the cathode 37 between ground 95 and an input terminal 38 through a coupling condenser 39. A grid leak 41, a cathode load resistor 42, and an anode potential supply source 43 are provided in conventional manner. A cathode bias is provided through a grid bias regulating resistor 44 as shown. An output transformer 45 is connected with its primary winding between the anode 40 and the positive terminal of the anode potential supply source 43. The secondary winding of the transformer 45 is connected to a pair of output terminals 46 and 47.

Figure 8:
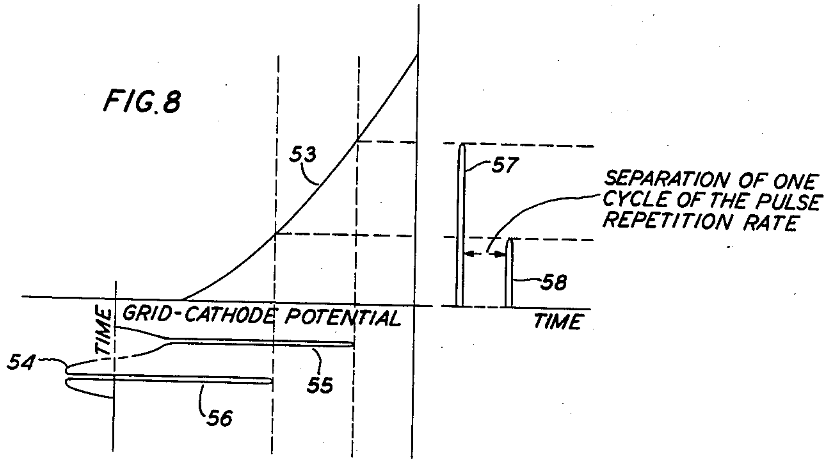
Fig. 8 is a set of graphs useful in explaining the operation of the circuit of Fig. 7.

Fig. 8 helps to explain a preferred method of operating the mixer of Fig. 7 whereby the sinusoidal signal wave is suppressed in the output. The curve 53 illustrates the anode current vs. grid-cathode potential characteristic of the tube 33. It is assumed that by means of proper proportioning of the resistors 42 and 44 in Fig. 7 the grid-cathode circuit is biased beyond cut-off, and sufficiently so that the impressed signal wave, represented by curve 54, produces no anode current in the absence of pulses. The pulses, when applied, are superimposed upon the signal current and may occur in general at any phase of the signal wave, as for example as shown at 55 and 56, respectively, the former being shown arising from a positive peak and the latter from a negative peak of the signal wave. The resulting anode current comprises pulses 57 and 58, respectively, which are essentially free from any component of the signal wave 54. In actual practice, the pulses 55, 56 are spaced apart at time intervals equal to full cycles of the standard frequency, for example, 10 kilocycles. Whether a given pulse is superimposed upon a positive peak, a negative peak, or upon some other portion of the signal wave depends upon the phase relationship between the pulse train and the signal wave. While pulses 55 and 56 are shown adjacent in Fig. 8, for economy of space, in practice the succeeding pulses will be spaced apart by one or more, up to 2000 or more cycles of the signal wave, broken lines being used in the figure to indicate an interval or intervals between pulses. The output pulses will always occur with the repetition rate of the standard frequency, for example 10 kilocycles, whatever the frequency of the signal wave.

While the particular form of mixer shown in Fig. 7 operated as shown by Fig. 8 illustrates very clearly the independence of the mixer output wave with respect to the particular harmonic which is closest to the frequency of the signal wave, it may also be shown that a control wave having such independence is present as a component part of the output wave from other sorts of mixers and by other methods of mixer operation. In any form of mixing device in which modulation occurs, such a control wave is present and may be selected and utilized.

In the example employing a pulse with a repetition rate of 10,000 per second, the pulse derived from the standard source contains components comprising all the multiples of 10,000 cycles per second up to say, 20 megacycles per second. The pulse is assumed so short that all the harmonics are of essentially the same intensity. Converting for convenience to kilocycles, the pulse contains components that are multiples of 10 kilocycles up to 20,000 kilocycles. Suppose that the wave to be synchronized (herein sometimes called the signal wave) is, for example, 1000 kilocycles. Then some of the frequency components of the pulse in kilocycles in the neighborhood of 1000 kilocycles are 940, 950, 960, 970, 980, 990, 1000, 1010, etc.

The modulation frequencies that are produced in the mixer and that are significant here are the sum and difference frequencies. Of these, the sum frequencies are all too high to pass through the coupling circuits that are provided as hereinafter described, an upper cut-off frequency of say 150 kilocycles being suitable. Some of the difference frequencies in kilocycles are —60, —50, —40, —30, —20, —10, 0, +10, +20, +30, +40, +50, +60, etc. In addition these frequencies also have a definite phase relation with respect to each other, in that all components of the pulse have a maximum value at the same time as the peak of the pulse. Since all the pulse components are assumed of equal intensity and are modulated with the same signal frequency, the shape of the output wave from the mixer is generally similar to that of the input wave (original pulse). The fact that fewer harmonics are included in the output wave than are present in the input wave is of course responsible for some more or less material change in wave shape. However, the shape of the output wave is independent of the particular harmonic that is closest in frequency to the signal wave, the same as in the case of the mixer shown in Fig. 7. The amplitude of the new pulse is related to the product of the original pulse magnitude, the magnitude of the wave of signal frequency, and to one more factor next to be defined.

Consider now the combinations of components that can produce a 10 kilocycle difference frequency. There are two, namely, 990 kilocycles and 1010 kilocycles, resulting in an output component proportional to $$\tfrac{1}{2}\cos[(2\pi\cdot 10\text{ kc.})t-\theta]+\tfrac{1}{2}\cos[(2\pi\cdot 10\text{ kc.})t+\theta] = \cos\theta\cos[(2\pi\cdot 10\text{ kc.})t] \quad (1)$$

where $\theta$ is the phase difference in degrees between the 1000 kilocycle wave and the 1000 kilocycle component of the pulse.

Similarly there are two combinations that result in a 20 kilocycle difference frequency, namely 980 kilocycles and 1020 kilocycles, resulting in an output component proportional to $$\tfrac{1}{2}\cos[(2\pi\cdot 20\text{ kc.})t-\theta]+\tfrac{1}{2}\cos[(2\pi\cdot 20\text{ kc.})t+\theta] = \cos\theta\cos[(2\pi\cdot 20\text{ kc.})t] \quad (2)$$

There will be a similar output component for each multiple of 10 kilocycles up to the upper cut-off frequency of the amplifier. The same angle $\theta$ appears in each term. Consequently, $\cos\theta$ is a factor of the expression for the new pulse.

Figure 9:
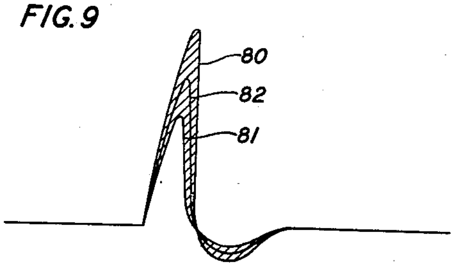
Fig. 9 is a sketch of pulse shapes such as may be viewed in an oscilloscope connected to a system according to the invention.

Since $\cos\theta$ can range in value between plus one and minus one, the new pulse can range between a maximum positive value and a maximum negative value. However, the new pulse is superimposed upon the original pulse which may be larger than the new pulse in which case the two are directly in phase with each other and generally similar in shape. Hence the resultant pulse varies in height as illustrated in Fig. 9 between two positive values as long as frequency locking has not been accomplished. Curve 80 represents the pulse of maximum height and curve 81 the pulse of minimum height. The pulse varies in height at a rate equal to the frequency difference between the signal wave and the nearest harmonic component of the pulse as will be verified mathematically hereinafter. In an oscilloscope a solid pattern appears between curves 80 and 81 as indicated by cross hatching in Fig. 9. When frequency locking occurs the pulse height ceases to vary but assumes a value dependent upon $\cos\theta$, which in turn depends upon the phase difference between the locked components. Curve 82 of Fig. 9 illustrates the pulse when locking has occurred. The wave forms of Fig. 9 are representative of the output of the mixer of Fig. 7 as well as of mixers in general.

The output wave of the mixer is modified by the network 31 with or without accompanying amplification and is converted into the final control wave by the detector 32.

It can be shown that stable frequency locking is obtainable over a certain range of values of $\theta$ while instability occurs over the remaining range. Assume first that a locked-in condition exists with $\theta$ equal to 90 degrees. Suppose then that the oscillator being controlled lowers its frequency slightly. This causes $\theta$ to increase, giving $\cos\theta$ a negative value and decreasing the height of the resultant pulses. If the connections of the automatic frequency control are such that decreasing the pulse height causes the automatic frequency control to lower the oscillator frequency still further, the system is evidently unstable. On the other hand, if decreasing the pulse height results in raising the oscillator frequency, stable operation is had. Assuming next that a locked-in condition exists with $\theta$ equal to 270 degrees, then a lowering of the oscillator frequency causes $\cos\theta$ to take on a positive value, increasing the pulse height. Stable operation at this value of $\theta$ is had if increasing the pulse height raises the oscillator frequency. Depending upon the internal arrangements of the automatic frequency control, stable operation will occur in the range of value of $\theta$ either from 0 to 180 degrees or from 180 degrees to 360 degrees, but not both. When $\theta$ reaches zero or 180 degrees, synchronism is lost. The system may then jump abruptly to the next adjacent harmonic or may simply exhibit instability and lack of control.

It can be verified mathmematically as follows that where the frequency of the oscillator to be controlled is not a harmonic of the pulse frequency, the amplitude of the output pulse from the mixer varies at the rate of frequency difference between the oscillator frequency and the nearest harmonic of the pulse frequency.

As a numerical example, take $(1000+\Delta)$ kilocycles as the oscillator frequency and 10 kilocycles as the pulse repetition frequency. The modulation products appearing in the output of the mixer are then of the type:

$$[\cos 2\pi(1000\text{ kc.}+\Delta\text{kc.})t][\ldots+\cos 2\pi(980\text{ kc.})t+\cos 2\pi(990\text{ kc.})t+\cos 2\pi(1000\text{ kc.})t+\cos 2\pi(1010\text{ kc.})t+\cos 2\pi(1020\text{ kc.})t+\ldots] \quad (3)$$

Developing some of the product terms of (3) each separately gives $$[\cos 2\pi(1000\text{ kc.}+\Delta\text{kc.})t][\cos 2\pi(990\text{ kc.})t] = \tfrac{1}{2}\cos 2\pi(1990\text{ kc.}+\Delta\text{kc.})t+\tfrac{1}{2}\cos 2\pi(10\text{ kc.}+\Delta\text{ kc.})t \quad (4)$$

$$[\cos 2\pi(1000\text{ kc.}+\Delta\text{kc.})t][\cos 2\pi(1000\text{ kc.})t] = \tfrac{1}{2}\cos 2\pi(2000\text{ kc.}+\Delta\text{kc.})t+\tfrac{1}{2}\cos 2\pi(\Delta\text{kc.})t \quad (5)$$

$$[\cos 2\pi(1000\text{ kc.}+\Delta\text{kc.})t][\cos 2\pi(1010\text{ kc.})t] = \tfrac{1}{2}\cos 2\pi(2010\text{ kc.}+\Delta\text{kc.})t+\tfrac{1}{2}\cos 2\pi(-10\text{ kc.}+\Delta\text{kc.})t \quad (6)$$

and so forth. The network 31 cuts off the summation terms leaving only the difference terms, for example, $$\tfrac{1}{2}\cos 2\pi(20\text{ kc.}+\Delta\text{kc.})t+\tfrac{1}{2}\cos 2\pi(-20\text{ kc.}+\Delta\text{kc.})t+\tfrac{1}{2}\cos 2\pi(10\text{ kc.}+\Delta\text{kc.})t+\tfrac{1}{2}\cos 2\pi(-10\text{ kc.}+\Delta\text{kc.})t+\tfrac{1}{2}\cos 2\pi(\Delta\text{kc.})t+\ldots \quad (7)$$

These terms fall into pairs as indicated in (7) and may be transformed into products:

$$[\cos 2\pi(\Delta\text{kc.})t][\cos 2\pi(20\text{ kc.})t]+[\cos 2\pi(\Delta\text{kc.})t][\cos 2\pi(10\text{ kc.})t]+\ldots+\tfrac{1}{2}\cos 2\pi(\Delta\text{kc.})t=[\cos 2\pi(\Delta\text{kc.})t][\tfrac{1}{2}+\cos 2\pi(10\text{ kc.})t+\cos 2\pi(20\text{ kc.})t+\ldots] \quad (8)$$

The expression (8) will again be recognized as a pulse of the same periodicity as the original pulse, and in phase with the original, but having an amplitude that varies periodically at the rate of Δkc., the frequency of deviation of the oscillator from the nearest harmonic of the original pulse.

It will be noted that each pair of components in the original pulse contributes to the modulation products that make up the new pulse, up to the limit of the pass band of the network 31. Thus, the broader the pass band the greater the height (voltage) of the new pulse and the stronger the control current, other things being equal. The noise increases in power in proportion to increased bandwidth, but the voltage due to the noise increases only as the square root of the bandwidth. There is obtained therefore an improvement in the signal-to-noise ratio by increasing the bandwidth to include more harmonics. This advantage is not found in prior art systems where a narrow band (restricted at best to a single interval between adjacent harmonics) is required in separating one harmonic from another. In the system of the invention the amplifier or network 31 bandwidth may be many times the interval between adjacent harmonics and is the same regardless of which harmonic is being used to synchronize.

The direct current output of the mixer, while it constitutes a current which is proportional to the term cos $\theta$, is preferably excluded as by a blocking condenser or a transformer or other means in the systems of the present invention. Instead, the plurality of alternating current modulation products is used as hereinabove described with attendant improvement in signal-to-noise ratio and improved stability in amplification of the control current.

It will be evident from the preceding description that an important consideration in extending the number of harmonic components that can be utilized for synchronization is the signal-to-noise ratio. Of the circuit elements (Fig. 3) producing the control potential for the automatic frequency control, the mixer 30 usually has the highest noise level and the detector or rectifier 32 the next highest. Direct current amplifiers, if used, are also a source of very high noise level. Alternating current amplifiers (with upper and lower cut-off frequencies) as may be used in the present invention, however, are relatively free from noise.

If it is desired to use only 200, say, of the harmonics of the base frequency, the pulse width for best results may have a maximum value of not more than about one four hundredth of a cycle of the pulse repetition frequency. With a given height of pulse, the energy content of the pulse is limited, the energy being proportional to the product of the width and height. As the noise energy introduced by the mixer 30 is fixed independently of the pulse, the signal-to-noise ratio for the mixer is thus dependent upon the number of harmonic components to be utilized. If the signal-to-noise ratio is too low, the frequency control will be irregular or ineffective, over the whole range of harmonic components.

If it is desired to utilize, for example, 2000 harmonics instead of 200, the pulse width will have to be reduced to one-tenth the former value. The energy content of the pulse will be reduced also to one-tenth, and, as the noise introduced by the mixer 30 is the same as before, the signal-to-noise ratio is necessarily degraded by a factor of ten.

It is found, however, that the noise introduced by the mixer 30 into the direct current component of the mixer output is very great relative to the noise introduced into the alternating current components. In accordance with the invention the direct current component of the mixer output is preferably blocked out from the succeeding circuits, only the alternating current components being passed along. The elimination of the direct current component at this stage results in a considerable increase in the signal-to-noise ratio. The pulse train with the direct current component removed is advantageously amplified in alternating current amplifiers, which, as stated above, are relatively noise-free. After sufficient amplification the pulse train is rectified or otherwise detected to produce a unidirectional control potential for use in the automatic frequency control. Because considerable amplification is employed, the pulse train is raised to a sufficiently high energy level readily to override the noise level in the detector.

As a result of applying the above principles of protection against introduction of excessive noise and other precautions herein described, the system of the invention has been made capable of synchronization with any one of 2000 or more harmonics of the base frequency.

With particular reference to the improvement in signal-to-noise ratio as affected by the band limits of the network 31 and associated amplifiers, if any, attention is again directed to Fig. 3, wherein the mixer 30 is connected to the detector 32 through the aperiodic network 31, which may or may not provide amplification as desired. The network 31 does provide suppression of direct current by any suitable means. A feature of the network 31 is that there is no manual adjustment or variable tuning required. The network is preferably broad band, passing a frequency interval several times as wide as the interval between adjacent harmonics of the standard frequency. A bare minimum bandwidth would include at least two harmonics, one odd and one even, e. g., 10 and 20 kilocycles or 30 and 40 kilocycles.

Various arrangements for supressing the direct current component and establishing a definite lower cut-off frequency in the network 31 are shown in Figs. 4, 5, and 6, respectively.

Fig. 4 shows the network 31 particularized in the form of a blocking condenser 48 and an (alternating current) amplifier 49.

Fig. 5 shows the blocking condenser 48 as replaced by a transformer 50, which may be the output transformer 45 of the mixer as shown in Fig. 7.

Fig. 6 shows the same system as shown in Fig. 5 except that the amplifier 49 is omitted. This arrangement is feasible, for example, where the detector 32 is voltage-actuated and the transformer 50 can be made to supply a sufficient amount of voltage step-up over the desired frequency pass band to operate the detector without the aid of an amplifier.

Amplification when employed, as in amplifier 49, is advantageously applied in two or more separate stages with signal shaping means inserted between stages as may be required to correct for wave shape distortion in the amplifying stages, in accordance with known techniques. Therefore, no detailed disclosure of amplifier 49 is deemed necessary. Also, the gain of the amplifier or amplifiers may be regulated to prevent too wide a holding range.

It is one of the important features of the invention that, where amplification is required in order to secure a sufficiently strong control wave, the amplification is applied in the path between the mixer and the detector rather than ahead of the mixer. If applied ahead of the mixer, the amplification must extend over the whole frequency band to be covered, up to and including the highest harmonic that is to be utilized. In the numerical example herein given this means an upper cut-off frequency of at least 20 megacycles, which places very severe requirements upon the amplifier. If the amplification is applied between the mixer and the detector on the other hand, the frequency band required is much less, and amplifiers of suitably wide bandwidth are readily obtainable. In the system described herein the bandwidth may be, for example, 150 kilocycles. Sufficient gain with good stability may be obtained over a bandwidth of this order of magnitude to meet the requirements of the system of the invention using known amplifier design.

The detector 32 is advantageously a rectifier of the voltage doubling type but may be of any other suitable variety. Output terminals 51 and 52 are shown connected to the rectifier.

The operation of the system of Fig. 3 as well as that of other embodiments of the invention is the same regardless of which harmonic the signal wave most nearly approaches in frequency. Furthermore, the output from the system is substantially the same in all cases over the whole range of 2000 or more harmonics. No manual tuning of the network 31 nor of any portion of the phase comparator is required when going from one harmonic to another.

Fig. 10 shows a system for producing any desired frequency without the limitation of the system of Figs. 1 and 2 to exact harmonics of the standard frequency.

In addition to elements 10 through 18 of Fig. 2, the system of Fig. 10 provides an additional auxiliary oscillator 60 of frequency F3 with automatic frequency control 61, two additional mixers 62 and 63, a second phase comparator 64, and an interpolation oscillator 65 with manually adjustable dial 66. Mixer 16 produces frequency $(F2-F1)$ as in Fig. 2. Mixer 62 produces frequency $(F3-F1)$ and mixer 63 produces frequency $(F2-F3)$. The output wave from phase comparator 18 actuates the automatic frequency control 15 to adjust the frequency of oscillator 14 to make the frequency $(F2-F1)$ synchronous with one of the harmonics of the standard frequency. Oscillator 12 as in Fig. 2 is set by means of dial 13 according to a calibration in terms of the desired harmonic. Frequency F1 is otherwise not controlled and frequency F2 is brought by the automatic frequency control to whatever frequency is required to secure synchronism. This control loop which controls $(F2-F1)$ is referred to as the high frequency loop.

An additional control loop is provided, which is referred to as the low frequency loop. The phase comparator 64 produces the control wave for the low frequency loop, comparing the output of mixer 63 with the output of the interpolation oscillator 65, and operating upon the automatic frequency control 61 to make the difference frequency $(F2-F3)$ equal to the frequency of the interpolation oscillator 65. With both the high frequency loop and the low frequency loop in operation, the difference between F3 and F1 is controlled to be equal to the labeled frequency of the interpolation oscillator dial 66 plus the labeled harmonic frequency selected by the setting of the dial 13. The utilization device 17 is connected to the output of the mixer 62 where the frequency $(F3-F1)$ appears.

The frequency error in the wave delivered to the utilization device does not exceed the sum of the calibration errors of the sources 10 and 65, as will now be demonstrated. Let F4 and F5 be the nominal frequencies of the source 65 and harmonic component of generator 11, respectively. Also let $\epsilon1$, $\epsilon2$, $\epsilon3$, $\epsilon4$, $\epsilon5$ represent the calibration errors of the frequencies F1, F2, F3, F4, F5, respectively. In terms of the frequencies and the calibration errors, the operation of the system of Fig. 10 may be analyzed as follows. Mixer 16 produces the difference frequency $(F2+\epsilon2)-(F1+\epsilon1)$. Phase comparator 18 compares the phase of this difference frequency with that of the harmonic $(F5+\epsilon5)$ and adjusts the value of $(F2+\epsilon2)$ until $$(F2+\epsilon2)-(F1+\epsilon1)=(F5+\epsilon5) \qquad (9)$$

which makes $$(F1+\epsilon1)=(F2+\epsilon2)-(F5+\epsilon5) \qquad (10)$$

Mixer 63 produces the difference frequency $$(F2+\epsilon2)-(F3+\epsilon3)$$

Phase comparator 64 compares the phase of this latter difference frequency with that of the selected frequency $(F4+\epsilon4)$ and adjusts the value of $(F3+\epsilon3)$ until $$(F2+\epsilon2)-(F3+\epsilon3)=(F4+\epsilon4) \qquad (11)$$

which makes $$(F3+\epsilon3)=(F2+\epsilon2)-(F4+\epsilon4) \qquad (12)$$

Finally, mixer 62 produces the difference frequency $$(F3+\epsilon3)-(F1+\epsilon1)$$

which by comparison of Equations 10 and 12 is seen to be $$\begin{aligned}(F3+\epsilon3)-(F1+\epsilon1)&=-(F4+\epsilon4)+(F5+\epsilon5)\\&=(F5-F4)+(\epsilon5-\epsilon4) \qquad (13)\end{aligned}$$

In words, the frequency of the wave delivered to the utilization device 17 is the difference of the nominal frequency F4, as set up on the interpolation oscillator 65, and the nominal frequency F5 of the selected harmonic of the frequency standard, the only errors remaining being the calibration errors of the interpolation oscillator and of the harmonic of the frequency standard.

The interpolation oscillator supplies a relatively low frequency and it need only cover a band as wide as the frequency difference between two adjacent harmonics of the standard base frequency. Therefore, the error of calibration may readily be made very small. Also, during use, the calibration of oscillator 65 may be checked with any suitable wavemeter or standard frequency source at one or more points on the dial 66 in manner well known in the art.

As to the error of the harmonic of the standard base frequency, this error is also very small, as the source 10 of the base frequency may be, if desired, the most precise source of standard frequency available. The high precision of the combination of base frequency source and interpolation oscillator is thus made available at any desired frequency and not merely at the harmonics of the base frequency. Precision of two cycles per second may readily be attained by this system at any frequency over a wide operating range and has in fact been achieved over a range covering all frequencies from 50 kilocycles up to 20 megacycles.

As has been noted hereinabove, to identify the ordinal number of a particular harmonic of the base frequency without ambiguity, it is necessary to keep the calibration error of the variable auxiliary oscillator 12 as controlled by the dial 13 within close limits, for example, not more than about ±3 kilocycles.

Essentially, it is desired to set up in a system such as that of Fig. 10, two waves differing in frequency by an accurately determined frequency interval, from which two waves the useful output difference frequency may be produced, as in a conventional heterodyne oscillator circuit. The frequency of one of these waves is F1 and is wanted to be accurately controlled by an exact integral multiple of the standard reference frequency. The frequency of the other wave is F3 and is wanted to be accurately controlled to differ by a constant frequency interval from a selected frequency produced by a calibrated interpolation oscillator. The frequency interval between the two waves is desired to be the exact sum of an unambiguously identified integral multiple of the standard reference frequency plus a selected additional frequency determined by the setting of the interpolation oscillator. It is further desired that the error in the resultant difference frequency be no greater than the sum of the error of the known integral multiple of the standard reference frequency plus the error of the calibration of the interpolation oscillator.

The two waves may be set up in any portion of the available frequency spectrum, it being desirable to select the portion with a view to favorable conditions for operation of the mixers and frequency generators required. A suitable frequency range is available, for example, in the neighborhood of 90,000 kilocycles, but other frequencies either lower or higher may be used as desired.

It is convenient to use a standard reference source having a fundamental frequency F of say 10 kilocycles, so that the integral multiples conform to a decimal system. The oscillator 12 furnishing the frequency F1 may then have its dial 13 calibrated at 10 kilocycle intervals.

The interpolation oscillator 65 by which F3 is controlled may have a working 10 kilocycle band located in any favorable portion of the available frequency spectrum. The minimum frequency of the interpolation oscillator, which frequency will be referred to as the "offset" is conveniently made an integral multiple of F, for example 90 kilocycles. The oscillator is then called upon to supply frequencies from 90 kilocycles to 100 kilocycles. A multiple of F other than the ninth harmonic may, however, be used as the offset frequency, or if desired an offset frequency not an integral multiple of F may be used.

Any one of the calibrated marks on the dial 13 may be labeled "zero" for the purposes of this invention and a scale, either descending or ascending, as desired, may be laid out, labeled in terms of harmonics from one up to the highest usable harmonic of the reference source. The zero should, of course, be so placed that the labeled points can all be accommodated within the useful range of the oscillator 12. If the zero mark corresponds to a measured frequency of 90,000 kilocycles, as in the frequency allocation scheme of Fig. 10, and a descending scale is used for F1, then 70,000 kilocycles measured frequency is labeled 20,000 kilocycles and other measured frequencies are labeled accordingly.

The labeled scale on the dial 66 of the interpolation oscillator 65 may be a descending one with reference to actual frequencies produced by the oscillator. In the frequency allocation scheme of Fig. 10, for example, where the measured frequency of 100 kilocycles is labeled zero, a measured frequency of 90 kilocycles should be labeled 10 kilocycles, and intermediate points labeled accordingly.

In order that the frequency contribution from the interpolation oscillator may be directly added to the selected harmonic of the reference source without ambiguity, the nominal frequency F2 of the oscillator 14 must differ from the labeled zero frequency on dial 13 by the highest frequency of oscillator 65. Where the offset is an integral multiple of F, the frequency F2 is readily set up by tuning oscillator 14 to the harmonic frequency differing from the zero reading by the amount of the highest frequency of oscillator 65 in the direction away from the labeled harmonics, 1, 2, 3, etc. Where zero corresponds to a measured frequency of 90,000 kilocycles, and the highest frequency of oscillator 65 is 100 kilocycles, F2 may be set at 90,100 kilocycles. During the operation of the system, the frequency F2 varies within a possible maximum range of plus and minus five kilocycles in order to compensate for inaccuracies in setting of dial 13, and to permit the turning of dial 13 in going from one desired setting to another with minimum duration of loss of synchronism between the output of mixer 16 and the nearest harmonic from source 10.

Oscillator 60 which provides frequency F3 is required to follow changes in F2 and to maintain a frequency difference between F3 and F2 that is determined by the setting of dial 66 of the interpolation oscillator. The initial setting of oscillator 60 may be accomplished readily by setting dials 13 and 66 to their labeled zeros and tuning oscillator 60 to the labeled zero frequency on dial 13. During operation of the system, the frequency F3 thereafter automatically varies according to the variation of F2. Where the scale on dial 13 is a descending one, oscillator 60 is called upon for variations over a 10 kilocycle band extending upward in frequency from the initial setting.

With the system thus set up, the dial 13 may be set to any desired harmonic ordinal number as shown by the labels on the dial. The high frequency control loop will then automatically adjust the frequency F2 until the difference between F1 and F2 is $$NF+kF \tag{14}$$

according to whichever value of N is nearest to the setting on the dial 13, where $kF$ is the maximum frequency of the interpolation oscillator. For the frequency allocation of Fig. 10, $$F2-F1=NF+kF \tag{15}$$

The dial 66 may be set at any desired setting, where LF4 designates the labeled value of the setting, and the low frequency control loop will automatically adjust F3 until the difference between F3 and F2 is $$kF-LF4 \tag{16}$$

For the frequency allocation of Fig. 10, $$F2-F3=kF-LF4 \tag{17}$$

The output frequency is then the difference between F3 and F1. For the frequency allocation of Fig. 10 the output frequency is $$\begin{aligned} F3-F1&=(F2-F1)-(F2-F3)\\ &=NF+kF-kF+LF4\\ &=NF+LF4 \end{aligned} \tag{18}$$

Expressed in words, the output frequency is the selected labeled harmonic frequency plus the labeled reading of the interpolation oscillator. The exact value of F2 is seen to be immaterial, as it cancels out in the expression (18) for the output frequency. The error of the output frequency is only that of the reference source plus that of the interpolation oscillator as hereinabove demonstrated in expression (13).

Other frequency allocations and scale labelings may readily be worked out by those skilled in the art guided by the general principles hereinabove outlined.

As an example of where to set the dials in the system of Fig. 10 for a desired output frequency, we may take say 19,683,421 cycles, for which the dial 13 is set to 19,680 kilocycles (19.680 megacycles) which corresponds to the 1968th harmonic of 10 kilocycles, and the dial 66 is set to 3,421 cycles.

The possibility of having the wrong harmonic determine the output frequency is nil provided the dial 13 is calibrated to the prescribed accuracy (±3 kilocycles in the example given) and the dial setting is made with at least as good precision to the mark which indicates the desired harmonic. Freedom from error is assured by the fact that only one freqeuncy is ever supplied by oscillator 12 to mixer 62. No extraneous harmonics of sufficient magnitude to cause trouble are even present. The spectrum of many closely spaced harmonics used for locking is confined to the phase comparator 18 wherein lock-in is effected to the nearest harmonic. There the ordinal number of the nearest harmonic is entirely immaterial.

The possibility of the wrong sideband being selected, thereby causing subtraction of the interpolation oscillator frequency from the desired harmonic of the standard where addition is desired, or vice versa, is also practically nil. In fact this sort of error can only come in if the nominal frequency F2 of oscillator 14 be shifted by an amount approximately equal to twice the offset frequency. As the high frequency control loop insures that F2 will not shift more than half the frequency interval between adjacent harmonics of the standard frequency and the offset can readily be made many times greater than this interval, the possibility of such a shift can readily be entirely ruled out in ordinary operation.

The device of Fig. 10, considered as a generator of a wave of known frequency, can be used as the interpolation oscillator for another device like that shown in Fig. 10, with appropriate differences in the frequencies employed.

Fig. 11 shows one way in which two devices, each like that of Fig. 10, may be combined to produce the same over-all result as the single device of Fig. 10, but with less stringent requirements upon the frequency precision of certain of the component generators.

In Fig. 11, the circuits to the left and right of the broken line 100, are designated 101 and 102 respectively, and each comprises substantially a complete unit like that of Fig. 10. The output wave from unit 101 is fed over a path 103 to unit 102 to serve as the output wave of an interpolation oscillator for unit 102. The output wave from unit 102 is fed over a path 204 to a utilization device 217.

The component parts of units 101 and 102 are numbered to correspond with the similar components in Fig. 10, by adding 100 to the number of reference character used in Fig. 10, in the case of unit 101 and by adding 200 in the case of unit 102. Legends applied to the component oscillators in Fig. 11, show a suitable frequency allocation for a two-unit system.

In unit 102, the frequency interval F between successive harmonics is 100 kilocycles and the offset is 100 kilocycles. The oscillator 212 may cover the range from 70 megacycles to 90 megacycles the same as the oscillator 12 of Fig. 10, but in steps of 100 kilocycles with an accuracy of ±30 kilocycles compared with steps of 10 kilocycles with an accuracy of ±3 kilocycles. The frequency of the oscillator 214 is nominally 90,200 kilocycles and the frequency of the oscillator 160 varies nominally between 90,000 kilocycles and 90,100 kilocycles. Since the harmonic interval here is 100 kilocycles, the interpolation oscillator for unit 201 should cover a band 100 kilocycles wide. Such a band may occupy any suitable portion of the available frequency range, for example, from 100 kilocycles to 200 kilocycles. To provide this frequency band in the output of unit 101, the source of standard frequency 110 may be a one-kilocycle source and an offset of two kilocycles may be used. The oscillator 112 may cover the range from 900 kilocycles to 1000 kilocycles in steps of one kilocycle, accurate to ±0.3 kilocycle. The oscillator 114 may have a nominal frequency of 1102 kilocycles and the frequency of the oscillator 160 varies nominally between 1099 kilocycles and 1100 kilocycles. The open 100 kilocycle interval between 1000 kilocycles and 1100 kilocycles is necessary to provide the desired offset in the unit 102.

The oscillator dial 113 may be so labeled that a measured frequency of 900 kilocycles is labeled zero and a measured frequency of 1000 kilocycles is labeled 100 kilocycles with an intermediate ascending scale continuously calibrated to any desired degree of accuracy.

Using as an example of how to set up the device of Fig. 11 for a desired output frequency, the same example of 19,683,421 cycles as was used in connection with Fig. 10; the dial 213 is set to 19.6 megacycles which corresponds to the 196th harmonic of 100 kilocycles. The dial 113 is set to 83 kilocycles which corresponds to the 83rd harmonic of one kilocycle and the dial 166 is set to 421 cycles.

The principles used in combining the units 101 and 102 of Fig. 11 to provide a combined system capable of performing the functions of the system of Fig. 10 may readily be extended to combining three or more units. Any unit like the system of Fig. 10 may serve as the interpolation oscillator for another such unit and any combination of two or more units may form a system serving as the interpolation oscillator for another unit or group of units. Each unit such as 101 or 102 depends for accuracy only upon the standard reference source used in the unit and upon the accuracy of the unit's source of interpolation frequency. Furthermore, each such unit or combination of units has all the advantages of the system of Fig. 10, including freedom from ambiguity of identification of the output frequency.

It is to be understood that the above described arrangements are illustrative of the principles of the invention and are not to be construed as limiting. Other arrangements within the spirit and scope of the invention may be readily devised by those skilled in the art.

What is claimed is:

1. A heterodyne oscillating system capable of being controlled in frequency by first and second calibrated sources, comprising first and second comparison oscillators each provided with an individual automatic frequency control, a calibrated auxiliary oscillator adjustable in frequency, a first mixer coupled to said auxiliary oscillator and said first comparison oscillator to produce a difference frequency wave therefrom, a first phase comparator jointly energized by one of the first mentioned calibrated sources and by the said difference frequency wave to actuate the automatic frequency control of the first comparison oscillator to maintain a frequency interval between the first comparison oscillator and the auxiliary oscillator equal to a selected harmonic of the said calibrated source, a second mixer coupled to both said comparison oscillators, a second phase comparator jointly energized by the second of the two calibrated sources and by the output of the second mixer to actuate the automatic frequency control of the second comparison oscillator to maintain a frequency interval between the said two comparison oscillators equal to a selected frequency from the second calibrated source, and a third mixer coupled to the calibrated auxiliary oscillator and to the second comparison oscillator to produce a difference frequency equal to the sum of the selected harmonic of one of the calibrated sources and a selected frequency from the other of said calibrated sources.

2. A system in accordance with claim 1, together with an aperiodic circuit comprising a part of the said first phase comparator and constituting a transmission element in the path between the first mixer and the automatic frequency control of the first comparison oscillator.

3. A system in accordance with claim 1, together with a broad band transmission device comprising a part of the said first phase comparator and lying in the transmission path between the first mixer and the automatic frequency control of the first comparison oscillator.

4. A system in accordance with claim 1, together with means blocking transmission of direct current comprising a part of the said first phase comparator.

5. A system for combining output waves from first and second calibrated oscillators of adjustable frequency and controlling the combined wave in locked frequency relation to a source of relatively short pulses recurring at a standard repetition frequency, said system comprising first and second auxiliary oscillators, first, second, and third mixers, said first mixer having said first calibrated oscillator and said first auxiliary oscillator connected to its input, said second mixer having said first and second auxiliary oscillators connected to its input, means for automatically controlling the frequency of the first auxiliary oscillator to maintian the output of the first mixer in locked frequency relation to the pulses from said source, means for automatically controlling the frequency of the second auxiliary oscillator to maintain the output of the second mixer in locked frequency relation to a wave from said second calibrated oscilaltor, and said third mixer having said first calibrated oscillator and said second auxiliary oscillator connected to its input.

6. A frequency locked heterodyne variable oscillator system comprising a source of pulses of standard repetition frequency, first and second calibrated oscillators of adjustable frequency, first and second auxiliary oscillators, a first heterodyne oscillating system comprising a combination of said first calibrated oscillator and said first auxiliary oscillator, a second heterodyne oscillating system comprising a combination of said first and second auxiliary oscillators, a first frequency control loop for maintaining the said first heterodyne oscillating system in frequency locked relation to said source of pulses, a second frequency control loop for maintaining said second heterodyne oscillating system in frequency locked relation to said second calibrated oscillator, and means for combining waves from said first calibrated oscillator with waves from said second auxiliary oscillator.

7. In an automatic frequency control system, an oscillator of variable-frequency voltage, means for varying the voltage frequency of said oscillator, a reference source of fixed-frequency voltage, a generator of a series of first voltage pulses connected to and actuated by the voltage of said reference source, said first voltage pulses comprising a plurality of harmonics of said fixed frequency having substantially uniform amplitudes and covering at least a frequency range including one harmonic to which a preselected frequency of said oscillator is to be locked, a mixer supplied with said voltage pulses and a portion of said variable-frequency voltage for producing output pulses recurring at harmonics of said fixed frequency and including a direct-current component, said output pulses comprising a series of second voltage pulses superimposed on said first voltage pulses and amplitude-modulated by the phase difference between the sum and difference frequencies between said preselected frequency of said oscillator voltage and the harmonics of said output pulses nearest to said last-mentioned frequency, aperiodic coupling means connected to the output of said mixer for blocking said direct-current component but passing certain frequency components, detecting means connected to the output of said coupling means for producing a unidirectional control voltage varying in magnitude and polarity in accordance with the amplitude variations of said certain frequency components, and circuit means for supplying said control voltage to said frequency varying means and thereby varying the frequency of said oscillator to effect lock-in between said preselected frequency of said oscillator voltage and said one harmonic of said first pulse series.

8. The frequency control system in accordance with claim 7 in which the said coupling means comprises a broad band circuit having a pass-band equivalent to at least 15 times the frequency interval between the harmonics of said first series of voltage pulses.

9. The frequency control system in accordance with claim 8 in which said broad band circuit includes amplifying means.

10. The frequency control system in accordance with claim 7 in which said detecting means comprises an electronic device.

11. The frequency control system in accordance with claim 7 in which said coupling means includes amplifying means connected between said mixer and said detecting means.

References Cited in the file of this patent

UNITED STATES PATENTS

| | | |
|---|---|---|
| 2,462,294 | Thompson | Feb. 22, 1949 |
| 2,510,095 | Frankel | June 6, 1950 |
| 2,521,070 | Linder et al. | Sept. 5, 1950 |
| 2,574,482 | Hugenholtz | Nov. 13, 1951 |
| 2,595,608 | Robinson et al. | May 6, 1952 |